United States Patent
Liu et al.

(10) Patent No.: US 8,501,616 B2
(45) Date of Patent: Aug. 6, 2013

(54) SELF-ALIGNED PROTECTION LAYER FOR COPPER POST STRUCTURE

(71) Applicant: Taiwan Semiconductor Manufacturing Company, Ltd., Hsinchu (TW)

(72) Inventors: Chung-Shi Liu, Shin-Chu (TW); Chen-Hua Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/660,348

(22) Filed: Oct. 25, 2012

(65) Prior Publication Data
US 2013/0049194 A1    Feb. 28, 2013

Related U.S. Application Data

(63) Continuation of application No. 12/786,698, filed on May 25, 2010, now Pat. No. 8,324,738.

(60) Provisional application No. 61/238,749, filed on Sep. 1, 2009.

(51) Int. Cl.
*H01L 21/44* (2006.01)

(52) U.S. Cl.
USPC .......................................................... 438/613

(58) Field of Classification Search
USPC ................................................. 438/612, 613
See application file for complete search history.

(56) References Cited

U.S. PATENT DOCUMENTS

| | | |
|---|---|---|
| 3,528,090 A | 9/1970 | Van Laer |
| 4,380,867 A | 4/1983 | Antson |
| 4,720,740 A | 1/1988 | Clements et al. |
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,134,460 A | 7/1992 | Brady et al. |
| 5,380,681 A | 1/1995 | Hsu |
| 5,391,917 A | 2/1995 | Gilmour et al. |

(Continued)

FOREIGN PATENT DOCUMENTS

| | | |
|---|---|---|
| JP | 1993335313 | 12/1993 |
| JP | 2000228420 | 8/2000 |

OTHER PUBLICATIONS

Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.

(Continued)

*Primary Examiner* — Jenny L Wagner
(74) *Attorney, Agent, or Firm* — Lowe Hauptman Ham & Berner, LLP

(57) ABSTRACT

A semiconductor device including a semiconductor substrate and a conductive post overlying and electrically connected to the substrate. The semiconductor device further includes a manganese-containing protection layer on a surface of the conductive post. A method of forming a semiconductor device. The method includes forming a bond pad region on a semiconductor substrate. The method further includes forming a conductive post overlying and electrically connected to the bond pad region. The method further includes forming a protection layer on a surface of the conductive post, wherein the protection layer comprises manganese (Mn).

20 Claims, 5 Drawing Sheets

(56) References Cited

U.S. PATENT DOCUMENTS

| | | |
|---|---|---|
| 5,448,114 A | 9/1995 | Kondoh et al. |
| 5,466,635 A | 11/1995 | Lynch et al. |
| 5,481,133 A | 1/1996 | Hsu |
| 5,510,298 A | 4/1996 | Redwine |
| 5,747,881 A | 5/1998 | Hosomi et al. |
| 5,767,001 A | 6/1998 | Bertagnolli |
| 5,998,292 A | 12/1999 | Black et al. |
| 6,002,177 A | 12/1999 | Gaynes et al. |
| 6,184,060 B1 | 2/2001 | Siniaguine |
| 6,187,678 B1 | 2/2001 | Gaynes et al. |
| 6,191,493 B1 | 2/2001 | Yasunaga et al. |
| 6,218,281 B1 | 4/2001 | Watanabe et al. |
| 6,229,216 B1 | 5/2001 | Ma et al. |
| 6,229,220 B1 | 5/2001 | Saitoh et al. |
| 6,232,563 B1 | 5/2001 | Kim et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,322,903 B1 | 11/2001 | Siniaguine et al. |
| 6,355,501 B1 | 3/2002 | Fung et al. |
| 6,426,556 B1 | 7/2002 | Lin |
| 6,434,016 B2 | 8/2002 | Zeng et al. |
| 6,448,168 B1 | 9/2002 | Rao et al. |
| 6,448,661 B1 | 9/2002 | Kim et al. |
| 6,464,895 B2 | 10/2002 | Forat et al. |
| 6,465,892 B1 | 10/2002 | Suga |
| 6,472,293 B1 | 10/2002 | Suga |
| 6,492,198 B2 | 12/2002 | Hwang |
| 6,538,333 B2 | 3/2003 | Kong |
| 6,562,653 B1 | 5/2003 | Ma et al. |
| 6,570,248 B1 | 5/2003 | Ahn et al. |
| 6,576,381 B1 | 6/2003 | Hirano et al. |
| 6,578,754 B1 | 6/2003 | Tung |
| 6,590,295 B1 | 7/2003 | Liao et al. |
| 6,592,019 B2 | 7/2003 | Tung |
| 6,599,778 B2 | 7/2003 | Pogge et al. |
| 6,600,222 B1 | 7/2003 | Levardo |
| 6,607,938 B2 | 8/2003 | Kwon et al. |
| 6,639,303 B2 | 10/2003 | Siniaguine |
| 6,661,085 B2 | 12/2003 | Kellar et al. |
| 6,664,129 B2 | 12/2003 | Siniaguine |
| 6,693,361 B1 | 2/2004 | Siniaguine et al. |
| 6,731,003 B2 | 5/2004 | Joshi et al. |
| 6,740,582 B2 | 5/2004 | Siniaguine |
| 6,762,076 B2 | 7/2004 | Kim et al. |
| 6,770,958 B2 | 8/2004 | Wang et al. |
| 6,790,748 B2 | 9/2004 | Kim et al. |
| 6,800,930 B2 | 10/2004 | Jackson et al. |
| 6,818,545 B2 | 11/2004 | Lee et al. |
| 6,828,677 B2 | 12/2004 | Yap et al. |
| 6,841,883 B1 | 1/2005 | Farnworth et al. |
| 6,853,076 B2 | 2/2005 | Datta et al. |
| 6,869,831 B2 | 3/2005 | Cowens et al. |
| 6,879,041 B2 | 4/2005 | Yamamoto et al. |
| 6,882,030 B2 | 4/2005 | Siniaguine |
| 6,887,769 B2 | 5/2005 | Kellar et al. |
| 6,908,565 B2 | 6/2005 | Kim et al. |
| 6,908,785 B2 | 6/2005 | Kim |
| 6,917,119 B2 | 7/2005 | Lee et al. |
| 6,924,551 B2 | 8/2005 | Rumer et al. |
| 6,943,067 B2 | 9/2005 | Greenlaw |
| 6,946,384 B2 | 9/2005 | Kloster et al. |
| 6,958,539 B2 | 10/2005 | Lay et al. |
| 6,962,867 B2 | 11/2005 | Jackson et al. |
| 6,962,872 B2 | 11/2005 | Chudzik et al. |
| 6,975,016 B2 | 12/2005 | Kellar et al. |
| 7,008,867 B2 | 3/2006 | Lei |
| 7,012,333 B2 | 3/2006 | Shimoyama et al. |
| 7,030,481 B2 | 4/2006 | Chudzik et al. |
| 7,037,804 B2 | 5/2006 | Kellar et al. |
| 7,049,170 B2 | 5/2006 | Savastiouk et al. |
| 7,056,807 B2 | 6/2006 | Kellar et al. |
| 7,060,601 B2 | 6/2006 | Savastiouk et al. |
| 7,064,436 B2 | 6/2006 | Ishiguri et al. |
| 7,071,546 B2 | 7/2006 | Fey et al. |
| 7,087,538 B2 | 8/2006 | Staines et al. |
| 7,111,149 B2 | 9/2006 | Eilert |
| 7,122,912 B2 | 10/2006 | Matsui |
| 7,151,009 B2 | 12/2006 | Kim et al. |
| 7,157,787 B2 | 1/2007 | Kim et al. |
| 7,193,308 B2 | 3/2007 | Matsui |
| 7,215,033 B2 | 5/2007 | Lee et al. |
| 7,262,495 B2 | 8/2007 | Chen et al. |
| 7,271,497 B2 | 9/2007 | Joshi et al. |
| 7,276,799 B2 | 10/2007 | Lee et al. |
| 7,279,795 B2 | 10/2007 | Periaman et al. |
| 7,297,574 B2 | 11/2007 | Thomas et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,335,972 B2 | 2/2008 | Chanchani |
| 7,345,350 B2 | 3/2008 | Sinha |
| 7,348,210 B2 | 3/2008 | Daubenspeck et al. |
| 7,355,273 B2 | 4/2008 | Jackson et al. |
| 7,391,112 B2 | 6/2008 | Li et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,462,942 B2 | 12/2008 | Tan et al. |
| 7,494,845 B2 | 2/2009 | Hwang et al. |
| 7,501,311 B2 | 3/2009 | Tsai |
| 7,524,755 B2 | 4/2009 | Widodo et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,566,650 B2 | 7/2009 | Lin et al. |
| 7,576,435 B2 | 8/2009 | Chao |
| 7,592,246 B2 | 9/2009 | Akram |
| 7,648,899 B1 | 1/2010 | Banerji et al. |
| 7,825,511 B2 | 11/2010 | Daubenspeck et al. |
| 7,834,450 B2 | 11/2010 | Kang |
| 7,928,534 B2 | 4/2011 | Hsu et al. |
| 2001/0000321 A1 | 4/2001 | Takeda et al. |
| 2002/0014705 A1 | 2/2002 | Ishio et al. |
| 2002/0033531 A1 | 3/2002 | Matsushima et al. |
| 2003/0156969 A1 | 8/2003 | Choi et al. |
| 2003/0216025 A1 | 11/2003 | Lu et al. |
| 2004/0166661 A1 | 8/2004 | Lei |
| 2005/0001324 A1 | 1/2005 | Dunn et al. |
| 2005/0077624 A1 | 4/2005 | Tan et al. |
| 2005/0179131 A1 | 8/2005 | Homma |
| 2006/0017160 A1 | 1/2006 | Huang |
| 2006/0043603 A1 | 3/2006 | Ranade et al. |
| 2006/0166402 A1 | 7/2006 | Lim et al. |
| 2006/0237842 A1 | 10/2006 | Shindo |
| 2006/0278982 A1 | 12/2006 | Solo |
| 2007/0023904 A1 | 2/2007 | Salmon |
| 2007/0080451 A1 | 4/2007 | Suh |
| 2007/0108606 A1 | 5/2007 | Watanabe |
| 2007/0284684 A1 | 12/2007 | Naito et al. |
| 2007/0287279 A1 | 12/2007 | Daubenspeck et al. |
| 2008/0296764 A1 | 12/2008 | Chang et al. |
| 2009/0011543 A1 | 1/2009 | Karta et al. |
| 2009/0026608 A1 | 1/2009 | Tsai et al. |
| 2009/0045511 A1 | 2/2009 | Meyer et al. |
| 2009/0096109 A1 | 4/2009 | Iwasaki |
| 2009/0098724 A1 | 4/2009 | Yu |
| 2009/0130840 A1 | 5/2009 | Wang et al. |
| 2009/0197114 A1 | 8/2009 | Shih et al. |
| 2009/0229857 A1 | 9/2009 | Fredenberg et al. |
| 2010/0090318 A1 | 4/2010 | Hsu et al. |
| 2010/0109159 A1 | 5/2010 | Ho et al. |
| 2010/0230810 A1 | 9/2010 | Kang et al. |
| 2011/0101523 A1 | 5/2011 | Hwang et al. |
| 2011/0101526 A1 | 5/2011 | Hsiao et al. |
| 2011/0156256 A1 | 6/2011 | Kang et al. |
| 2011/0227216 A1 | 9/2011 | Tseng et al. |
| 2011/0281432 A1 | 11/2011 | Farooq et al. |
| 2012/0112350 A1* | 5/2012 | Kriz et al. .................. 257/770 |

OTHER PUBLICATIONS

Kim, K. J., et al., "Chemical Interaction, Adhesion and Diffusion Properties at the Interface of Cu and Plasma-Treated Thiophene- Based Plasma Polymer (ThioPP) Films", Thin Solid Films 398-399 (2001), pp. 657-662.

Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.

Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

U.S. Appl. No. 61/258,414, filed Nov. 5, 2009, Chien Ling Hwang et al.

U.S. Appl. No. 61/230,012, filed Jul. 30, 2009, Chun-Shi Liu et al.

U.S. Appl. No. 61/258,393, filed Nov. 5, 2009, Chien Ling Hwang et al.

* cited by examiner

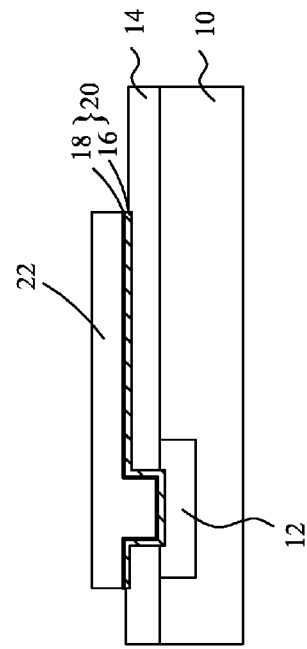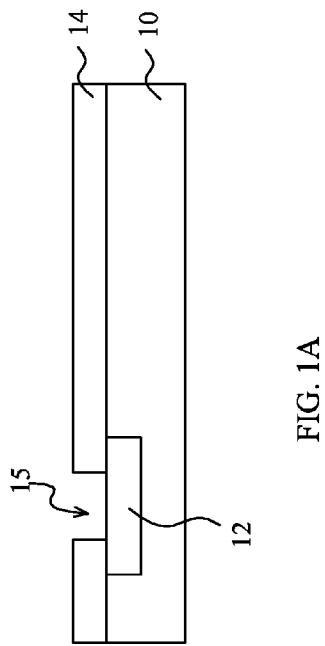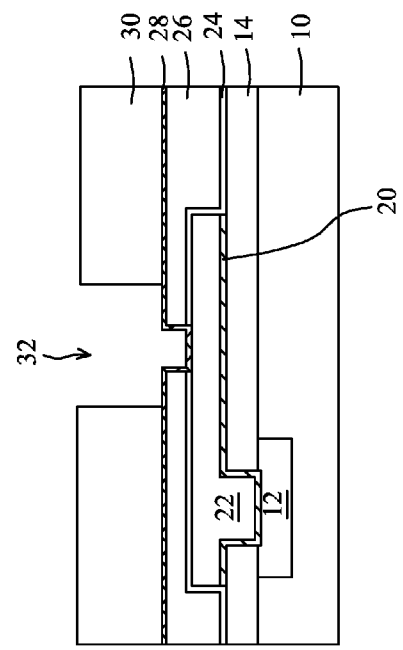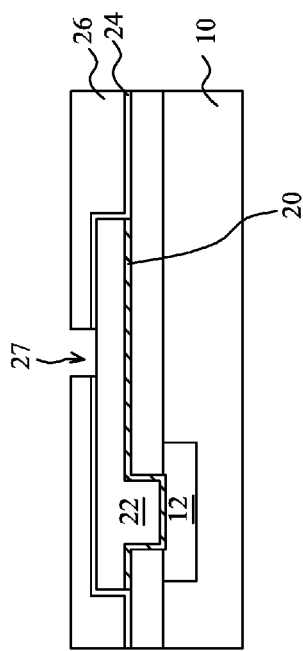

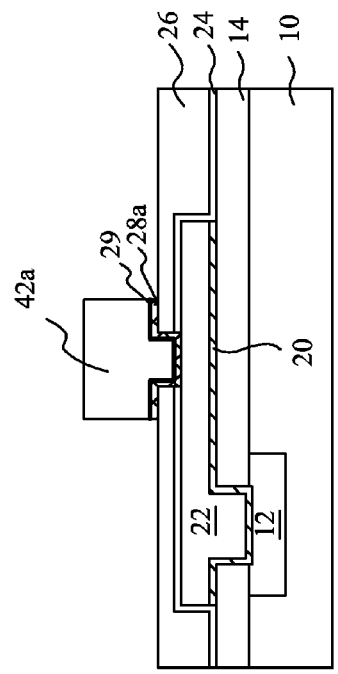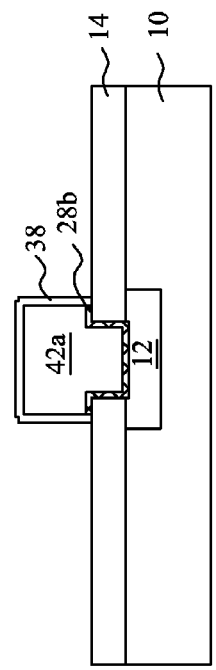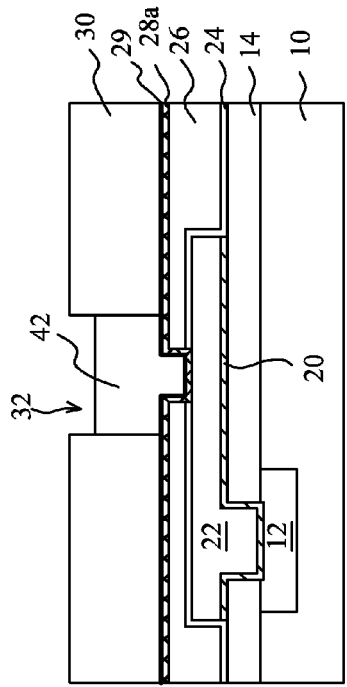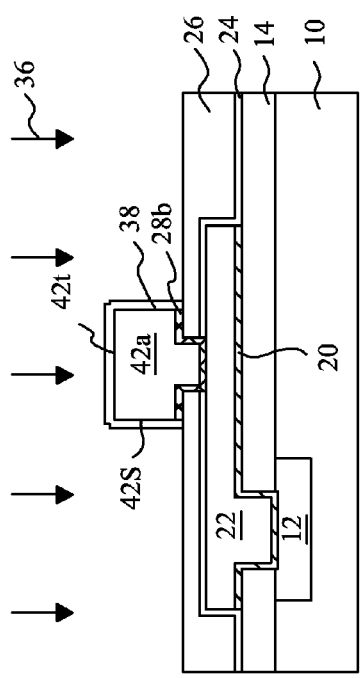
FIG. 5A
FIG. 5B
FIG. 5C
FIG. 6

SELF-ALIGNED PROTECTION LAYER FOR COPPER POST STRUCTURE

CROSS-REFERENCE TO RELATED APPLICATIONS

The present application is a continuation application of U.S. application Ser. No. 12/786,698, filed May 25, 2010, which claims priority of U.S. Provisional Patent Application Ser. No. 61/238,749 filed on Sep. 1, 2009, both of which are incorporated herein by reference in their entirety.

TECHNICAL FIELD

This disclosure relates to the fabrication of semiconductor devices, and more particularly, to bump structures of semiconductor devices.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Wafer level chip scale packaging (WLCSP) is currently widely used for its low cost and relatively simple processes. In a typical WLCSP, interconnect structures are formed on metallization layers, followed by the formation of under-bump metallurgy (UBM), and the mounting of solder balls.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in this order on the I/O pad. The bumps themselves, based on the material used, are classified as solder bumps, gold bumps, copper pillar bumps and bumps with mixed metals. Recently, copper interconnect post technology is proposed. Instead of using solder bump, the electronic component is connected to a substrate by means of copper post. The copper interconnect post technology achieves finer pitch with minimum probability of bump bridging, reduces the capacitance load for the circuits and allows the electronic component to perform at higher frequencies. However, copper has a tendency to be oxidized during manufacturing processes. The oxidized copper post may lead to poor adhesion of the electronic component to a substrate. The poor adhesion causes serious reliability concerns due to high leakage currents. The oxidized copper post may also lead to underfill cracking along the interface of the underfill and the copper post. The cracks may propagate to low-k layers or the solder used to bonding the copper post to the substrate.

BRIEF DESCRIPTION OF THE DRAWINGS

The aforementioned objects, features and advantages of this disclosure will become apparent by referring to the following detailed description of the preferred embodiments with reference to the accompanying drawings, wherein:

FIGS. 1A to 1G are cross-sectional diagram depicting an exemplary embodiment of a Cu post process;

FIGS. 5A to 5C are cross-sectional diagram depicting an exemplary embodiment of a Cu post process;

FIG. 6 is a cross-sectional diagram depicting an exemplary embodiment of a Cu post structure;

DETAILED DESCRIPTION OF ILLUSTRATIVE EMBODIMENTS

Figure 1E:
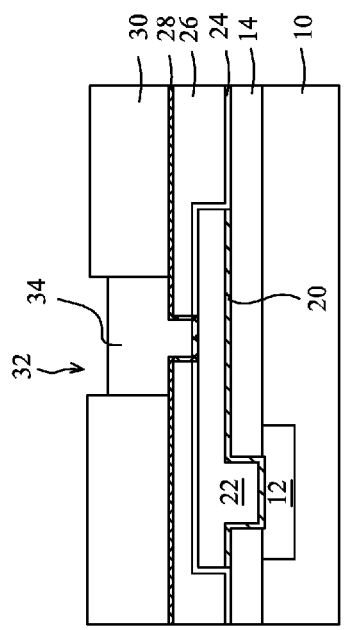

In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

This disclosure provides a novel integrated circuit structure formed in a copper interconnect post process and methods of forming the same. Throughout this disclosure, the term "copper (Cu) post" refers to a copper protrusion formed over a bond pad, and/or a copper-containing protrusion formed over an interconnection layer over the bond pad. As used throughout this disclosure, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium.

Herein, cross-sectional diagrams of FIG. 1A to FIG. 1G illustrate an exemplary embodiment of a Cu post structure.

In FIG. 1A, an example of a substrate 10 used for Cu post interconnection fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The integrated circuits as used herein refer to electronic circuits having multiple individual circuit elements, such as transistors, diodes, resistors, capacitors, inductors, and other active and passive semiconductor devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers. A conductive region 12 is a top metallization layer formed in a top-level inter-layer dielectric layer, which is a portion of conductive routs and has an exposed surface treated by a planarization process, such as chemical mechanical polishing (CMP), if necessary. Suitable materials for the conductive region 12 may include, but are not limited to, for example copper, aluminum, copper alloy, or other mobile conductive materials. In one embodiment, the conductive region 12 is a bond pad region 12, which may be used in the bonding process to connect the integrated circuits in the respective chip to external features.

FIG. 1A also illustrates a passivation layer 14 formed on the substrate 10 and patterned to form an opening 15 exposing a portion of the conductive region 12. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

Referring to FIG. 1B, an adhesion layer 16 and a seed layer 18 are formed and patterned on a portion of the passivation layer 14 and line the sidewalls and bottom of the opening 15. Also, a post-passivation interconnect (PPI) line 22 is formed and patterned on the layers 16 and 18 and fills the opening 15. The adhesion layer 16, also referred to as a glue layer, is blanket formed, covering the passivation layer 14 and the sidewalls and the bottom of opening 15. The adhesion layer 16 may include commonly used barrier materials such as titanium, titanium nitride, tantalum, tantalum nitride, and combinations thereof, and can be formed using physical vapor deposition, sputtering, and the like. The adhesion layer 16 helps to improve the adhesion of the subsequently formed copper lines onto passivation layer 14. The seed layer 18 is blanket formed on the adhesion layer 16. The materials of the seed layer 18 include copper or copper alloys, and metals such as silver, gold, aluminum, and combinations thereof may also be included. The seed layer 18 may also include aluminum or aluminum alloys. In an embodiment, the seed layer 18 is formed of sputtering. In other embodiments, other commonly used methods such as physical vapor deposition or electroless plating may be used. For clarity, the seed layer 18 and the adhesion layer 16 are shown as layers 20 in subsequent drawings.

Using a mask and a photolithography process, a conductive material fills the opening of the mask followed by removing the mask and the exposed layers 20. The conductive material formed on the layer 20 and filling the opening 15 serves as the PPI line 22. The PPI line 22 may include, but not limited to, for example copper, aluminum, copper alloy, or other mobile conductive materials. The PPI line 22 may further include a nickel-containing layer (not shown) on the top a copper-containing layer. The PPI formation methods include plating, electroless plating, sputtering, chemical vapor deposition methods, and the like. The PPI line 22 connects the bond pad region 12 to bump features. The PPI line 22 may also function as power lines, re-distribution lines (RDL), inductors, capacitors or any passive components. The PPI line 22 may have a thickness less than about 30 μm, for example between about 2 μm and about 25 μm. Then the exposed portions of the layers 20 including the adhesion layer 16 and the seed layer 18 are removed. The removal step may include a wet etching process or a dry etching process. In one embodiment, the removal step includes an isotropic wet etching using an ammonia-based acid, which may be a flash etching with a short duration.

Next, in FIG. 1C, a dielectric layer 24, also referred to as an isolation layer or a passivation layer, is formed on the passivation layer 14 and the PPI line 22. The dielectric layer 24 may be formed of dielectric materials such as silicon nitride, silicon carbide, silicon oxynitride or other applicable materials. The formation methods include plasma enhance chemical vapor deposition (PECVD) or other commonly used CVD methods. Then a polymer layer 26 is formed on the dielectric layer 24 through the steps of coating, curing, descum and the like. Lithography technology and etching processes such as a dry etch and/or a wet etch process are then performed to pattern the polymer layer 26 and an opening 27 passing through the polymer layer 26 and the dielectric layer 24, thus exposing a portion of the underlying PPI line 22. The polymer layer 26, as the name suggests, is preferably formed of a polymer, such as an epoxy, polyimide, benzocyclobutene (BCB), polybenzoxazole (PBO), and the like, although other relatively soft, often organic, dielectric materials can also be used. In one embodiment, the polymer layer 26 is a polyimide layer. The polymer layer 26 is soft, and hence has the function of reducing inherent stresses on the substrate. In addition, the polymer layer 26 can easily be formed to thickness of tens of microns.

In FIG. 1D, the formation of an under-bump-metallurgy (UBM) layer 28 includes a diffusion barrier layer and a seed layer is performed on the resulted structure. The UBM layer 28 is formed on the polymer layer 26 and the exposed portion of the PPI line 22, and lines the sidewalls and bottom of the opening 27. The diffusion barrier layer, also referred to as a glue layer, is formed to cover the sidewalls and the bottom of the opening 27. The diffusion barrier layer may be formed of tantalum nitride, although it may also be formed of other materials such as titanium nitride, tantalum, titanium, or the like. The formation methods include physical vapor deposition (PVD) or sputtering. The seed layer may be a copper seed layer formed on the diffusion barrier layer. The seed layer may be formed of copper alloys that include silver, chromium, nickel, tin, gold, and combinations thereof. In one embodiment, the UBM layer 28 is a Cu/Ti layer.

Next, a mask layer 30 is provided on the UBM layer 28 and patterned with an opening 32 exposing a portion of the UBM layer 28 for bump formation. The opening 32 is over the opening 27. In one embodiment, the diameter of the opening 32 is greater or equal to the diameter of the opening 27. The mask layer 30 may be a dry film or a photoresist film.

Referring to FIG. 1E, the opening 32 is filled with a Cu alloy layer 34. The formation methods may include sputtering, printing, electro plating, electroless plating, and commonly used chemical vapor deposition (CVD) methods. For example, electro-chemical plating (ECP) is carried out to form the Cu alloy layer 34. In one embodiment, the Cu alloy layer 34 is a copper-manganese (CuMn) layer. The ratio of manganese (Mn) to copper contained in the CuMn layer is not limited. In other embodiments, Ti, Al, Nb, Cr, V, Y, Tc, Re, or the like can be utilized as an additive metal for forming the Cu alloy layer 34.

Figure 1F:
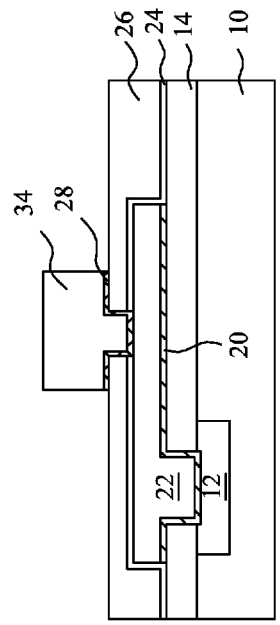

Next, as shown in FIG. 1F, the mask layer 30 is removed. In the case the mask layer 30 is a dry film, it may be removed using an alkaline solution. If the mask layer 30 is formed of photoresist, it may be removed using acetone, n-methyl pyrrolidone (NMP), dimethyl sulfoxide (DMSO), aminoethoxy ethanol, and the like. Then the exposed portion of the UBM layer 28 is etched to expose the underlying polymer layer 26 outside the Cu alloy layer 34. In an exemplary embodiment, the step of removing the UBM layer 28 is a dry etching or a wet etching. For example, an isotropic wet etching (often referred to as flash etching due to its short duration) using an ammonia-based acid is employed. Thus the Cu alloy layer 34 protrudes from the polymer layer 26.

Figure 1G:
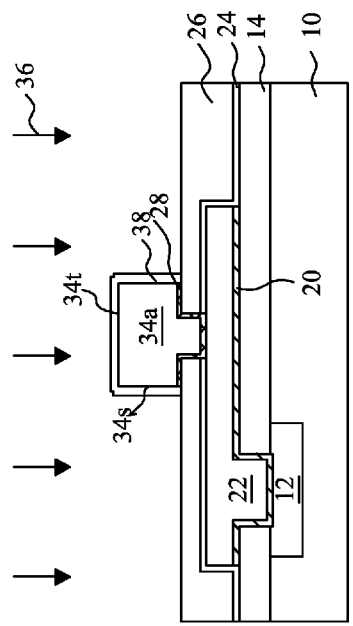

Thereafter, in FIG. 1G, Using an annealing process 36, the Mn existed in the Cu alloy layer 34 diffuses out from the Cu alloy layer 34, and thus the Cu alloy layer 34 with less Mn refers to a Cu post 34a. The ratio of Mn to copper contained in the Cu post 34a is less than the ratio of Mn to copper contained in the Cu alloy layer 34. Also, the diffused-out Mn reacts with the annealing ambient to form a protection layer 38 in a self-aligned manner at the surface of the Cu post 34a. The protection layer 38 may be formed at the top surface 34t and the sidewall surface 34s of the Cu post 34a. In one embodiment, during an annealing process with $NH_3$ or $N_2/H_2$ ambient, the Mn will react with nitrogen to form a manganese nitride ($MnN_x$) layer as the protection layer 38 in a self-aligned manner at the surface of the Cu post 34a. Alternatively, during the annealing process 36, copper oxidation layer ($CuO_x$) at the surface of the Cu post 34a is reduced, forming a manganese oxide layer, such as $MnO_x$ or $MnO_xN_y$ as the protection layer 38 in a self-aligned manner at the surface of the Cu post 34a. The protection layer 38 can lower resistance and prevent copper diffusion to enhance back end of the line (BEOL) performance. Moreover, the protection layer can improve the adhesion between the Cu post 34a formed by ECP method and the underlying Cu layer formed by PVD method, and thus the Cu peeling issue can be suppressed. Further, the protection layer 38 formed in a self-aligned manner can prevent openings existed in the dielectric layer adjacent the bottom of the opening, thus solving the contact issue. These can improve package capabilities.

The substrate 10 may then be sawed and packaged onto a package substrate, or another die, with solder balls or Cu posts mounted on a pad on the package substrate or the other die.

Figure 2:
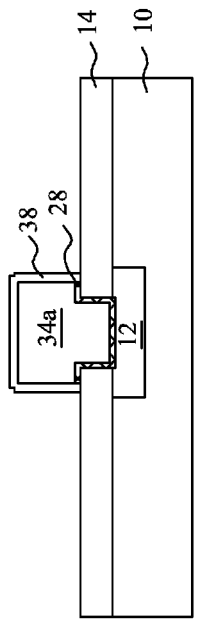
FIG. 2 is a cross-sectional diagram depicting an exemplary embodiment of a Cu post structure.

FIG. 1F is a cross-sectional diagram illustrating an exemplary embodiment of a Cu post 34a with the surface protection layer 38 formed overlying the PPI line 22 that is electrically connected to the bond pad region 12. FIG. 2 is a cross-sectional diagram illustrating an exemplary embodiment of the Cu post 34a with a surface protection layer 38 overlying and electrically connecting the bond pad region 12, while explanation of the same or similar portions to the description in FIG. 1G will be omitted. As depicted in FIG. 2, the UBM layer 28 is formed on the sidewalls and bottom of the opening 15 in the passivation layer 14, and the Cu post 34a is formed on the UBM layer 28 to fill the opening 15 and protrude from the passivation layer 14. The protection layer 38 is formed in a self-aligned manner on the top surface and the sidewall surface of the Cu post 34a. Thus the Cu post 34a and the UBM layer 28 are formed directly on the bond pad region 12.

Figure 3A:
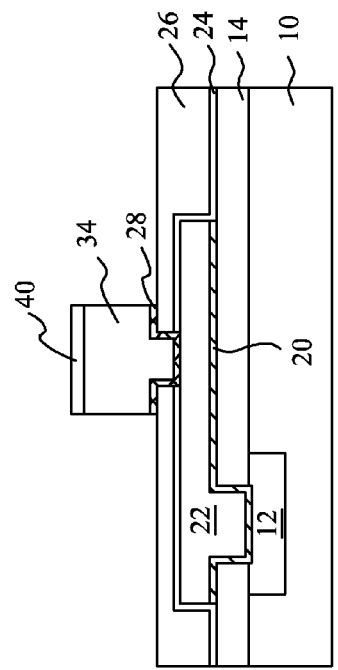
FIGS. 3A to 3C are cross-sectional diagram depicting an exemplary embodiment of a Cu post process.
Figure 3C:
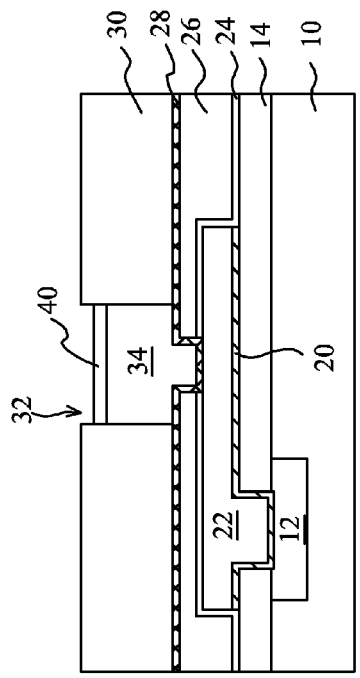
Figure 3B:
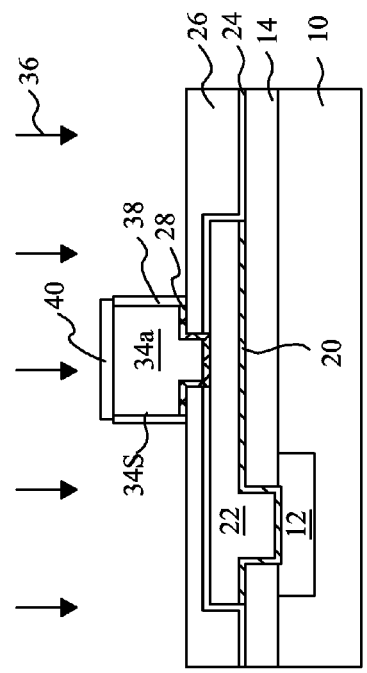

FIG. 3A to FIG. 3C are cross-sectional diagrams depicting an exemplary embodiment of a Cu post structure with a cap layer, while explanation of the same or similar portions to the description in FIG. 1A to FIG. 1G will be omitted.

Referring to FIG. 3A, after forming the Cu alloy layer 34 in the opening 32 of the mask layer 30, a cap layer 40 is deposited on the Cu alloy layer 34 within the opening 32. The cap layer 40 could act as a barrier layer to prevent copper in the Cu post 24a to diffuse into bonding material, such as solder ball, that is used to bond the substrate 10 to external features. The prevention of copper diffusion increases the reliability and bonding strength of the package. The cap layer 40 may include nickel, tin, tin-lead (SnPb), gold (Au), silver, palladium (Pd), In, nickel-palladium-gold (NiPdAu), nickel-gold (NiAu), other similar materials, or alloy. In one embodiment, the cap layer 40 is a lead-free pre-solder layer, for example, SnAg. In another embodiment, the cap layer 40 is a solder material including alloys of tin, lead, silver, copper, nickel, bismuth, or combinations thereof. In the other embodiment, the cap layer 40 is a nickel layer, an Au layer, or a NiAu layer. After removing the mask layer 30 and the UBM layer 28 no covered by the Cu alloy layer 34 as depicted in FIG. 3B, the annealing process 36 is performed to form the protection layer 38 in a self-aligned manner at the sidewall surface 34t of the Cu post 34a. The protection layer 38 may be a manganese nitride ($MnN_x$) layer, or a manganese oxide layer, such as $MnO_x$ or $MnO_xN_y$.

Figure 4:
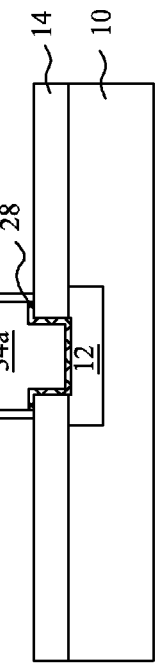
FIG. 4 is a cross-sectional diagram depicting an exemplary embodiment of a Cu post structure.

FIG. 4 is a cross-sectional diagram illustrating an exemplary embodiment of the Cu post 34a with a surface protection layer 38 and a cap layer 40 overlying and electrically connecting the bond pad region 12. The UBM layer 28 is formed on the sidewalls and bottom of the opening 15 in the passivation layer 14, and the Cu post 34a is formed on the UBM layer 28 to fill the opening 15 and protrude from the passivation layer 14. The protection layer 38 is formed in a self-aligned manner on the sidewall surface of the Cu post 34a. The cap layer 40 is formed on the top surface of the Cu post 34a. Thus the Cu post 34a and the UBM layer 28 are formed directly on the bond pad region 12.

FIG. 5A to FIG. 5C are cross-sectional diagrams depicting an exemplary embodiment of a Cu post structure, while explanation of the same or similar portions to the description in FIG. 1A to FIG. 1G will be omitted.

Referring to FIG. 5A, after the formation of the opening 27 in the polymer layer 26 as depicted in FIG. 1C, an under-bump-metallurgy (UBM) layer 28a including a diffusion barrier layer is formed on the resulted structure. The UBM layer 28a is formed on the polymer layer 26 and the exposed portion of the PPI line 22, and lines the sidewalls and bottom of the opening 27. The diffusion barrier layer, also referred to as a glue layer, may be formed of tantalum nitride, although it may also be formed of other materials such as titanium nitride, tantalum, titanium, or the like. In one embodiment, the UBM layer 28a is a Ti layer.

Next, a Cu ally film 29 is deposited on the UBM layer 28a, lining the sidewalls and bottom of the opening 27. The formation methods may include sputtering, printing, electro plating, electroless plating, and commonly used chemical vapor deposition (CVD) methods. In one embodiment, the Cu alloy film 29 is a copper-manganese (CuMn) layer. The ratio of manganese (Mn) to copper contained in the CuMn layer is not limited. In other embodiments, Ti, Al, Nb, Cr, V, Y, Tc, Re, or the like can be utilized as an additive metal for forming the Cu alloy film 29. For example, forming the Cu alloy film 29 with the concentration gradient of the Mn as described above by a physical method, such as sputtering like a PVD (physical vapor deposition), may be considered.

Thereafter, the mask layer 30 with the opening 32 is provided on the Cu alloy film 29, and then a copper deposition process, for example electro-chemical plating (ECP) is carried out to form a Cu layer 42 on the Cu alloy film 29 and fill the opening 32. Thus the underlying bond pad region 12 can be electrically connected to the Cu layer 42. The Cu layer 42 includes substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In FIG. 5B, the mask layer 30 is removed to make the Cu layer 42 protrude from the polymer layer 26 to become a Cu post 42a. Then the exposed portion of the Cu alloy film 29 and the UBM layer 28a is etched to expose the underlying polymer layer 26.

In FIG. 5C, using an annealing process 36, the Mn existed in the Cu alloy film 29 diffuses out to decrease the Mn ratio to Cu in the Cu alloy film 29. Also, the out-diffused Mn reacts with the annealing ambient to form a protection layer 38 in a self-aligned manner at the surface of the Cu post 42a. In one embodiment, the UBM layer underlying the Cu post 42a becomes an UBM layer 28b including the diffusion barrier layer 28a and a copper layer after the self-aligned protection formation. In other embodiments, Mn may remain in the UBM layer 28b.

The protection layer 38 may be formed at the top surface 42t and the sidewall surface 42s of the Cu post 42a. In one embodiment, during an annealing process with $NH_3$ or $N_2/H_2$ ambient, the Mn will react with nitrogen to form a manganese nitride ($MnN_x$) layer as the protection layer 38 in a self-aligned manner at the surface of the Cu post 42a. Alternatively, during the annealing process 36, copper oxidation layer ($CuO_x$) at the surface of the Cu post 42a is reduced, forming a manganese oxide layer, such as $MnO_x$ or $MnO_xN_y$ as the protection layer 38 in a self-aligned manner at the surface of the Cu post 42a. The protection layer 38 can lower resistance and prevent copper diffusion to enhance BEOL SPICE performance. Moreover, the protection layer can improve the adhesion between the Cu post 42a formed by ECP method and the underlying Cu layer formed by PVD method, and thus the Cu peeling issue can be suppressed. Further, the protection layer 38 formed in a self-aligned manner can prevent openings existed in the dielectric layer adjacent the bottom of the opening, thus solving the contact issue. These can improve package capabilities.

FIG. 6 is a cross-sectional diagram illustrating an exemplary embodiment of the Cu post 42a with a surface protection layer 38 overlying and electrically connecting the bond pad region 12, while explanation of the same or similar portions to the description in FIG. 5A to FIG. 5C will be omitted.

Figure 7A:
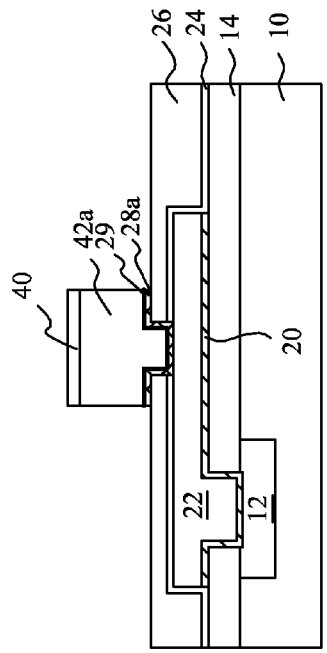
FIGS. 7A to 7C are cross-sectional diagram depicting an exemplary embodiment of a Cu post process.
Figure 7B:
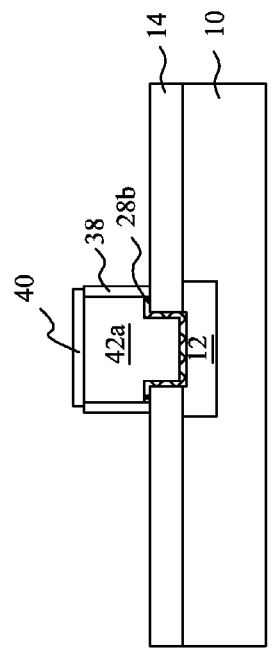
Figure 7C:
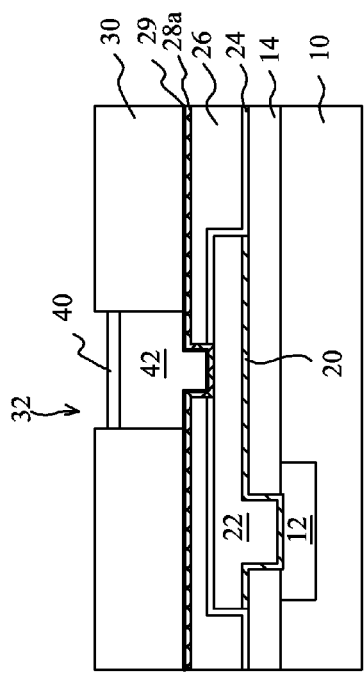

FIG. 7A to FIG. 7C are cross-sectional diagrams depicting an exemplary embodiment of a Cu post structure with a cap layer, while explanation of the same or similar portions to the description in FIG. 5A to FIG. 5C will be omitted.

Referring to FIG. 7A, after forming the Cu layer 42 in the opening 32 of the mask layer 30, a cap layer 40 is deposited on the Cu layer 42 within the opening 32. The cap layer 40 could act as a barrier layer to prevent copper in the Cu post 42a to diffuse into bonding material, such as solder ball, that is used to bond the substrate 10 to external features. The prevention of copper diffusion increases the reliability and bonding strength of the package. The cap layer 40 may include nickel, tin, tin-lead (SnPb), gold (Au), silver, palladium (Pd), indium (In), nickel-palladium-gold (NiPdAu), nickel-gold (NiAu) or other similar materials or alloy. In one embodiment, the cap layer 40 is a lead-free pre-solder layer, for example, SnAg. In another embodiment, the cap layer 40 is a solder material including alloys of tin, lead, silver, copper, nickel, bismuth, or combinations thereof. In the other embodiment, the cap layer 40 is a nickel layer, an Au layer, or a NiAu layer. After removing the mask layer 30 and the exposed UBM layer 28a and the Cu alloy film 29 as depicted in FIG. 7B, the annealing process 36 is performed to form the protection layer 38 in a self-aligned manner at the sidewall surface 42t of the Cu post 42a. The protection layer 38 may be a manganese nitride ($MnN_x$) layer, or a manganese oxide layer, such as $MnO_x$ or $MnO_xN_y$.

Figure 8:
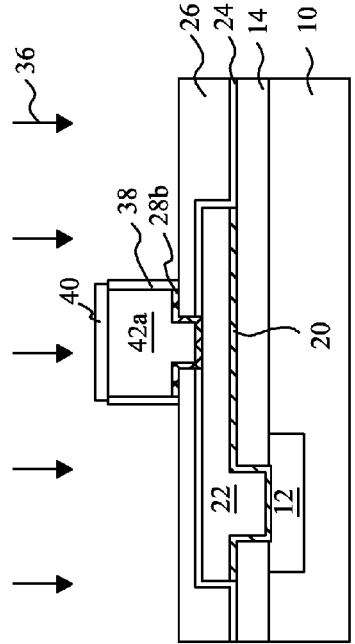
FIG. 8 is a cross-sectional diagram depicting an exemplary embodiment of a Cu post structure.

FIG. 8 is a cross-sectional diagram illustrating an exemplary embodiment of the Cu post 42a with a surface protection layer 38 and a cap layer 40 overlying and electrically connecting the bond pad region 12.

One aspect of this description relates to a semiconductor device. The semiconductor device includes a semiconductor substrate and a conductive post overlying and electrically connected to the substrate. The semiconductor device further includes a manganese-containing protection layer on a surface of the conductive post.

Another aspect of this description relates to a method of forming a semiconductor device. The method includes forming a bond pad region on a semiconductor substrate. The method further includes forming a conductive post overlying and electrically connected to the bond pad region. The method further includes forming a protection layer on a surface of the conductive post, wherein the protection layer comprises manganese (Mn).

Still another aspect of this description relates to a method of forming a semiconductor device. The method includes forming a bond pad region on a semiconductor substrate. The method further includes forming a conductive post overlying and electrically connected to the bond pad region, the conductive post comprising a copper-manganese alloy. The method further includes forming a manganese-containing protection layer on sidewalls of the conductive post.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. A semiconductor device, comprising:
    a semiconductor substrate;
    a conductive post overlying and electrically connected to the substrate; and
    a manganese-containing protection layer on a surface of the conductive post.

2. The semiconductor device of claim 1, wherein the manganese-containing protection layer is a self-aligned protection layer.

3. The semiconductor device of claim 1, further comprising a conductive region formed in the substrate configured to electrically connect the substrate to the conductive post.

4. The semiconductor device of claim 3, further comprising a post-passivation interconnect line configured to electrically connect the conductive region and the conductive post.

5. The semiconductor device of claim 1, further comprising an under bump metallurgy (UBM) layer between the substrate and the conductive post.

6. The semiconductor device of claim 5, wherein the manganese-containing protection layer covers sidewalls of the conductive post and sidewalls of the UBM layer.

7. A method of forming a semiconductor device, the method comprising:
   forming a bond pad region on a semiconductor substrate;
   forming a conductive post overlying and electrically connected to the bond pad region; and
   forming a protection layer on a surface of the conductive post, wherein the protection layer comprises manganese (Mn).

8. The method of claim 7, wherein forming the conductive post comprises forming the conductive post containing an alloy comprising manganese.

9. The method of claim 8, wherein forming the protection layer comprises annealing the alloy conductive post to diffuse the manganese in the alloy conductive post to the surface of the conductive post.

10. The method of claim 9, wherein annealing the alloy conductive post comprises annealing the alloy conductive post in an environment containing at least one of $NH_3$ or $N_2$, and the protection layer comprises manganese nitride.

11. The method of claim 9, wherein forming the conductive post comprises forming a copper-manganese alloy post, and annealing the copper-manganese alloy conductive post comprises reducing copper oxide and forming manganese oxide.

12. The method of claim 7, further comprising forming a post-passivation interconnect line to electrically connect the conductive post to the bond pad.

13. The method of claim 7, further comprising forming an under bump metallurgy (UBM) layer between the bond pad and the conductive post, wherein the protection layer covers sidewalls of the conductive post and the UBM layer.

14. A method of forming a semiconductor device, the method comprising:
   forming a bond pad region on a semiconductor substrate;
   forming a conductive post overlying and electrically connected to the bond pad region, the conductive post comprising a copper-manganese alloy; and
   forming a manganese-containing protection layer on sidewalls of the conductive post.

15. The method of claim 14, wherein forming the manganese-containing protection layer comprises annealing the copper-manganese alloy of the conductive post.

16. The method of claim 15, wherein annealing the copper-manganese alloy comprises annealing the copper-manganese alloy in an environment containing at least one of $NH_3$ or $N_2$, to form a self-aligned manganese nitride protection layer.

17. The method of claim 14, further comprising forming the manganese-containing protection layer over a top surface of the conductive post.

18. The semiconductor device of claim 1, further comprising a copper alloy layer between the substrate and the conductive post.

19. The semiconductor device of claim 18, wherein the copper alloy layer includes a gradient manganese concentration.

20. The method of claim 7, further comprising forming a copper alloy layer between the bond pad region and the conductive post.

* * * * *